United States Patent
Fan et al.

(10) Patent No.: US 12,096,596 B2
(45) Date of Patent: Sep. 17, 2024

(54) POWER ELECTRONICS DEVICE ASSEMBLIES INCLUDING DUAL GRAPHITE LAYERS AND COLD PLATES INCORPORATING THE SAME

(71) Applicant: Toyota Motor Engineering & Manufacturing North America, Inc., Plano, TX (US)

(72) Inventors: Tianzhu Fan, Houston, TX (US); Feng Zhou, Ann Arbor, MI (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 74 days.

(21) Appl. No.: 17/968,162

(22) Filed: Oct. 18, 2022

(65) Prior Publication Data
US 2024/0130076 A1 Apr. 18, 2024

(51) Int. Cl.
*H05K 7/20* (2006.01)
*H01L 23/367* (2006.01)
(Continued)

(52) U.S. Cl.
CPC ....... *H05K 7/20254* (2013.01); *H01L 23/367* (2013.01); *H05K 1/0204* (2013.01);
(Continued)

(58) Field of Classification Search
CPC .. H05K 7/20254; H05K 7/2039; H05K 7/205; H05K 7/20509; H05K 7/2089; H05K 7/209; H05K 7/20936; H05K 1/0204; H05K 1/0209; H05K 1/0272; H05K 1/0298; H05K 1/05; H05K 1/185; H05K 1/188; H05K 3/0061; H05K 3/022; H05K 3/30;
(Continued)

(56) References Cited

U.S. PATENT DOCUMENTS 10,149,413 B1 * 12/2018 Dede .................. H05K 7/20927
11,869,760 B1 * 1/2024 Zhou .................. H05K 7/20254
(Continued)

FOREIGN PATENT DOCUMENTS

CN 205383911 U 7/2016
DE 102015100389 A1 7/2015
(Continued)

OTHER PUBLICATIONS

Thin Copper-Graphite Composite Cold Plate for Thermal Management of High Density Electronics (https://www.highergov.com/contract/W9113M07C0077/), Aug. 25, 2022.

*Primary Examiner* — Amir A Jalali
(74) *Attorney, Agent, or Firm* — Dinsmore & Shohl LLP

(57) ABSTRACT

A power electronics assembly, power electronics device assemblies, and a cold plate incorporating power electronics device assemblies are disclosed. The power electronics assembly includes a cold plate including a power electronics device assembly including an S-cell and a power electronics device. The S-cell includes a first graphite layer a second graphite layer and a metal layer encasing the first graphite layer and the second graphite layer. A recess is formed in an outer surface of the metal layer. The power electronics device is disposed within the recess of the outer surface of the S-cell.

18 Claims, 6 Drawing Sheets

(51) Int. Cl.
  *H05K 1/02* (2006.01)
  *H05K 1/05* (2006.01)
  *H05K 3/00* (2006.01)
(52) U.S. Cl.
  CPC ............ *H05K 1/0298* (2013.01); *H05K 1/05* (2013.01); *H05K 3/0061* (2013.01); *H05K 7/209* (2013.01)
(58) Field of Classification Search
  CPC ........... H05K 3/4697; H05K 2201/064; H05K 2201/10166; H01L 21/4803; H01L 21/4882; H01L 23/3121; H01L 23/367; H01L 23/3735; H01L 23/4006; H01L 23/427; H01L 23/473; H01L 23/49827; H01L 25/0655; H01L 25/072; H01L 25/16; H01L 25/18; H01L 25/50; H01L 2023/4087; H01L 2224/04105; H01L 2224/32225; H01L 2924/15153; H01L 2924/1517; F28F 3/02; F28F 3/12; F28D 15/0233
  See application file for complete search history.

(56) References Cited

U.S. PATENT DOCUMENTS

| | | | |
|---|---|---|---|
| 2017/0110385 A1* | 4/2017 | Kawajiri | H01L 23/36 |
| 2018/0211899 A1* | 7/2018 | Morianz | H01L 24/20 |
| 2022/0039252 A1* | 2/2022 | Zhou | H05K 1/185 |
| 2022/0053634 A1* | 2/2022 | Zhou | H01L 23/427 |
| 2023/0012318 A1* | 1/2023 | Zhou | H05K 1/0272 |
| 2023/0022829 A1* | 1/2023 | Zhou | H01L 23/3735 |
| 2023/0247807 A1* | 8/2023 | Zhou | H05K 7/20509 361/711 |
| 2024/0063090 A1* | 2/2024 | Zhou | H01L 23/473 |
| 2024/0064943 A1* | 2/2024 | Zhou | H05K 7/20927 |

FOREIGN PATENT DOCUMENTS

| | | |
|---|---|---|
| JP | 2019071399 A | 5/2019 |
| TW | 201007112 A | 2/2010 |
| WO | 2007016649 A2 | 2/2007 |
| WO | 2017023478 A1 | 9/2017 |

\* cited by examiner

POWER ELECTRONICS DEVICE ASSEMBLIES INCLUDING DUAL GRAPHITE LAYERS AND COLD PLATES INCORPORATING THE SAME

TECHNICAL FIELD

The present specification generally relates to power electronic assemblies and, more specifically, apparatus and methods for power electronic assemblies having low overall thermal resistance while achieving a compact package size.

BACKGROUND

Due to the increased use of electronics in vehicles, there is a need to make electronic systems more compact. One component of these electronic systems is a power electronic device used as a switch in an inverter. Power electronic devices have large cooling requirements due to the heat generated.

Additionally, there has been a trend for power electronic devices conventionally composed of silicon to now be composed of silicon-carbide. The use of silicon-carbide causes a larger heat flux due to it defining a smaller device footprint. Moreover, power electronics device assemblies include one or more graphite layers to facilitate heat spreading. However, such graphite layers do not provide uniform heat spreading capabilities along each axis.

For these reasons, and more, there is a need to improve the cooling of power electronic devices while maintaining a compact package size.

SUMMARY

In one embodiment, a power electronics assembly includes: a cold plate including: a power electronics device assembly including: an S-cell and a power electronics device. The S-cell includes: a first graphite layer; a second graphite layer; and a metal layer encasing the first graphite layer and the second graphite layer, a recess formed in an outer surface of the metal layer. The power electronics device is disposed within the recess of the outer surface of the S-cell.

In another embodiment, a power electronics device assembly includes: an S-cell and a power electronics device. The S-cell includes: a first graphite layer; a second graphite layer; and a metal layer encasing the first graphite layer and the second graphite layer, a recess formed in an outer surface of the metal layer. The power electronics device is disposed within the recess of the outer surface of the S-cell.

In yet another embodiment, a power electronics assembly includes: a cold plate including: a plurality of power electronics device assemblies including: an S-cell and a power electronics device. The S-cell includes: a first graphite layer oriented to provide a low thermal conductivity along a first axis and a high thermal conductivity along a second axis and a third axis; and a second graphite layer oriented to provide a low thermal conductivity along the second axis and a high thermal conductivity along the first axis and the third axis; and a metal layer encasing the first graphite layer and the second graphite layer, a recess formed in an outer surface of the metal layer. The power electronics device is disposed within the recess of the outer surface of the S-cell. The plurality of power electronics device assemblies are embedded within respective recesses formed in a surface of the cold plate.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Figure 1:
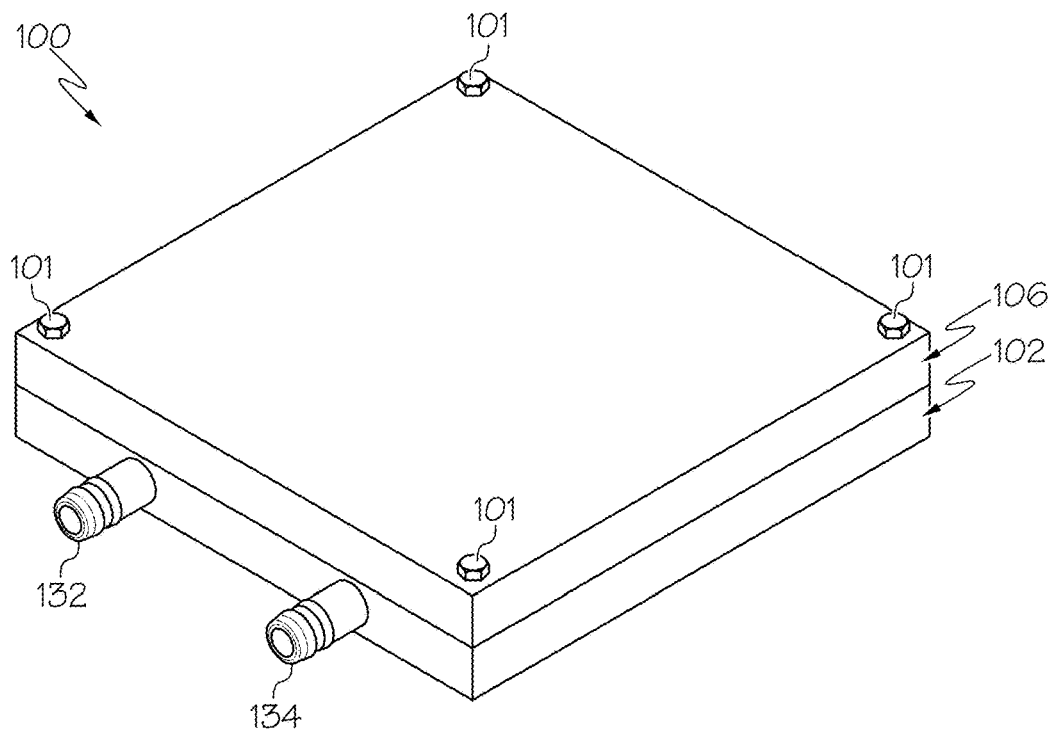
FIG. 1 schematically depicts a perspective view of an example power electronics assembly, according to one or more embodiments described and illustrated herein.

Embodiments described herein are generally directed to power electronics device assemblies and power electronics assemblies having a circuit board assembly coupled to a cold plate, the cold plate including the power electronics device assemblies provided within respective recesses formed in the cold plate. A power electronics device may be embedded within a recess formed within an S-cell of each power electronics device assembly.

The power electronics device assemblies of the present disclosure include a power electronics device affixed to a mounting substrate referred to herein as an S-cell. As described in more detail below, the S-cell includes a pair of graphite layers that provide enhanced heat spreading capabilities. Further, embodiments of the present disclosure include one or more electrical isolation layers that electrically isolate the power electronics device(s) from a cold plate. For example, an electrically insulating layer of the S-cell enables the removal of an electrical insulation layer between the printed circuit board and the cold plate because the electrical isolation is provided by the S-cell itself.

As described in more detail below, the S-cells of the present disclosure provide enhanced thermal properties due to graphite layers that promote heat flux flow toward a cold plate. The S-cells described herein include stacked metal, graphite, and one or more electrically insulating layers in a compact package. The graphite layers each have a crystalline offset by 90 degrees to balance heat spreading capabilities across three axes of the graphite layers. The bonding materials described herein for bonding the S-cells are particularly adapted for increased thermal conductivity relative to other bonding technologies, while also maintaining an ability of electrically insulate the S-cells. The devices, systems, and apparatuses described herein improves the heat flux from the S-cell to the cold plate, thereby increasing heat spreading and cooling performance for the circuit board assembly.

The cold plates, power electronics device assemblies, circuit board assemblies, power electronics assemblies, and the like described herein may be used in electrified vehicles, such as and without being limited to, an electric vehicle, a hybrid electric vehicle, any electric motor, generators, industrial tools, household appliances, and the like. The various assemblies described herein may be electrically coupled to an electric motor and/or a battery, and may be configured as an inverter circuit operable to convert direct current (DC) electrical power to alternating current (AC) electrical power.

As used herein, a "power electronics device" means any electrical component used to convert DC electrical power to AC electrical power and vice-versa. Embodiments may also be employed in AC-AC converter and DC-DC converter applications. Non-limiting examples of power electronics devices include power metal-oxide-semiconductor field effect transistors (MOSFET), insulated-gate bipolar transistors (IGBT), thyristors, and power transistors.

As used herein, the phrase "fully embedded" means that each surface of a component is surrounded by a substrate. For example, when a power electronics device assembly is fully embedded by a circuit board substrate, it means that the material of the circuit board substrate covers each surface of the circuit board substrate. A component is "partially embedded" when one or more surfaces of the component are exposed.

As used herein, an "S-cell" is a mounting substrate operable to be affixed to a power electronics device and includes one or more of a metal layer, a graphite layer, and an electrically insulating layer.

Various embodiments of power electronics assemblies, power electronics device assemblies, and cold plates are described in detail below. Whenever possible, the same reference numerals will be used throughout the drawings to refer to the same or like parts.

Figure 2:
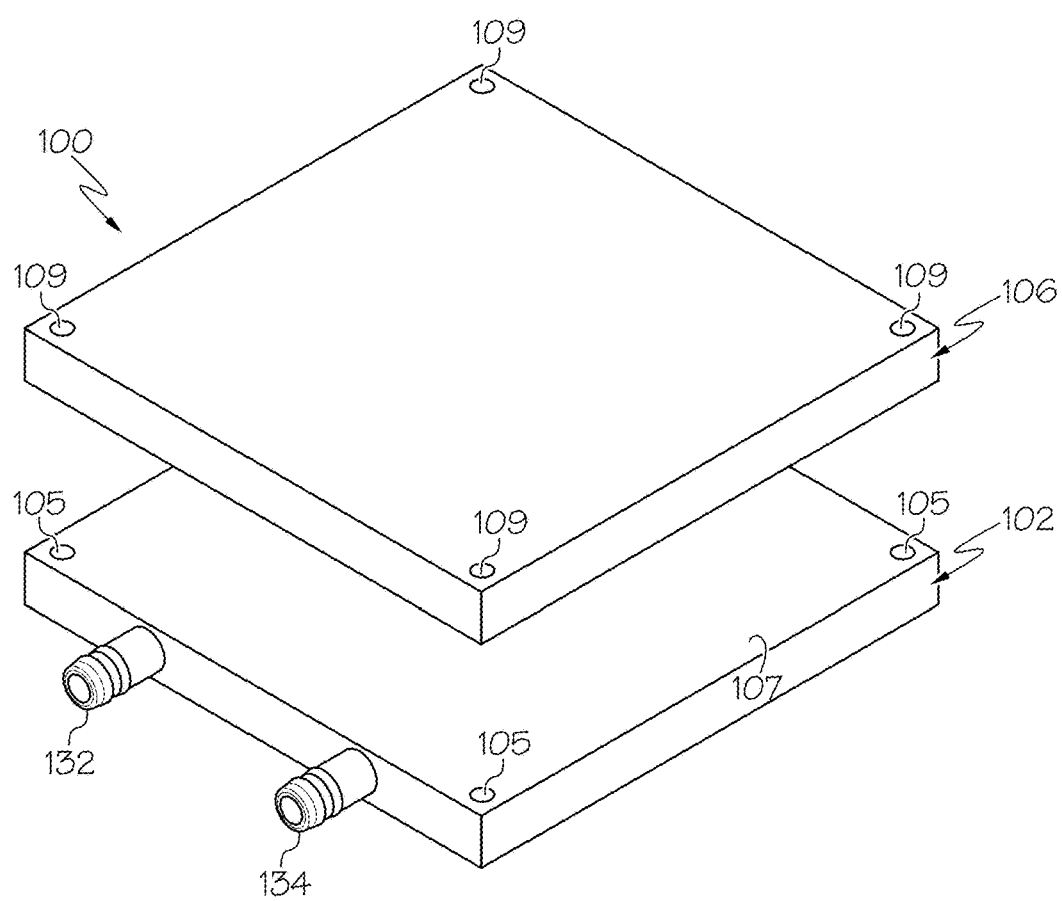
FIG. 2 schematically depicts an exploded perspective view of the power electronics assembly of FIG. 1, according to one or more embodiments described and illustrated herein.

Referring now to FIGS. 1 and 2, an example power electronics assembly 100 is generally illustrated in an assembled view and an exploded view, respectively. The power electronics assembly 100 illustrated in FIGS. 1 and 2 includes a cold plate 102 and a circuit board assembly 106. The cold plate 102 may be any device capable of removing heat flux from power electronics devices 140 (see FIG. 3) coupled to or embedded within a cavity 103 of the cold plate 102 and/or coupled to or embedded within a substrate material of the circuit board assembly 106. Non-limiting examples for the cold plate 102 include heat sinks, single-phase liquid cooling, two-phase liquid cooling, and vapor chambers.

FIGS. 1 and 2 illustrate the cold plate 102 has being configured as a single-phase liquid cooling device. The cold plate 102 includes a fluid inlet 132 and a fluid outlet 134 fluidly coupled to a fluid chamber 115 (FIG. 9) within the cold plate 102. While FIGS. 1 and 2 depict the fluid inlet 132 and the fluid outlet 134 as being on the same side of the cold plate 102, the present disclosure is not limited to such an embodiment. That is, in other embodiments, the fluid inlet 132 and the fluid outlet 134 may be positioned on other surfaces of the cold plate 102 such as, for example, adjacent surfaces.

Referring still to FIGS. 1 and 2, the circuit board assembly 106 is coupled (e.g., affixed such as by lamination or any other suitable means) to a first surface 107 of the cold plate 102. FIGS. 1 and 2 illustrate the circuit board assembly 106 as being affixed to the first surface 107 of the cold plate 102 by way of fasteners 101 (e.g., bolts and nuts) extending through through-holes 105 of the cold plate 102 and through-holes 109 of the circuit board assembly 106. It should be appreciated that, in other embodiments, the through-holes 105, 109 and fasteners 101 may be omitted, as described below.

Figure 10:
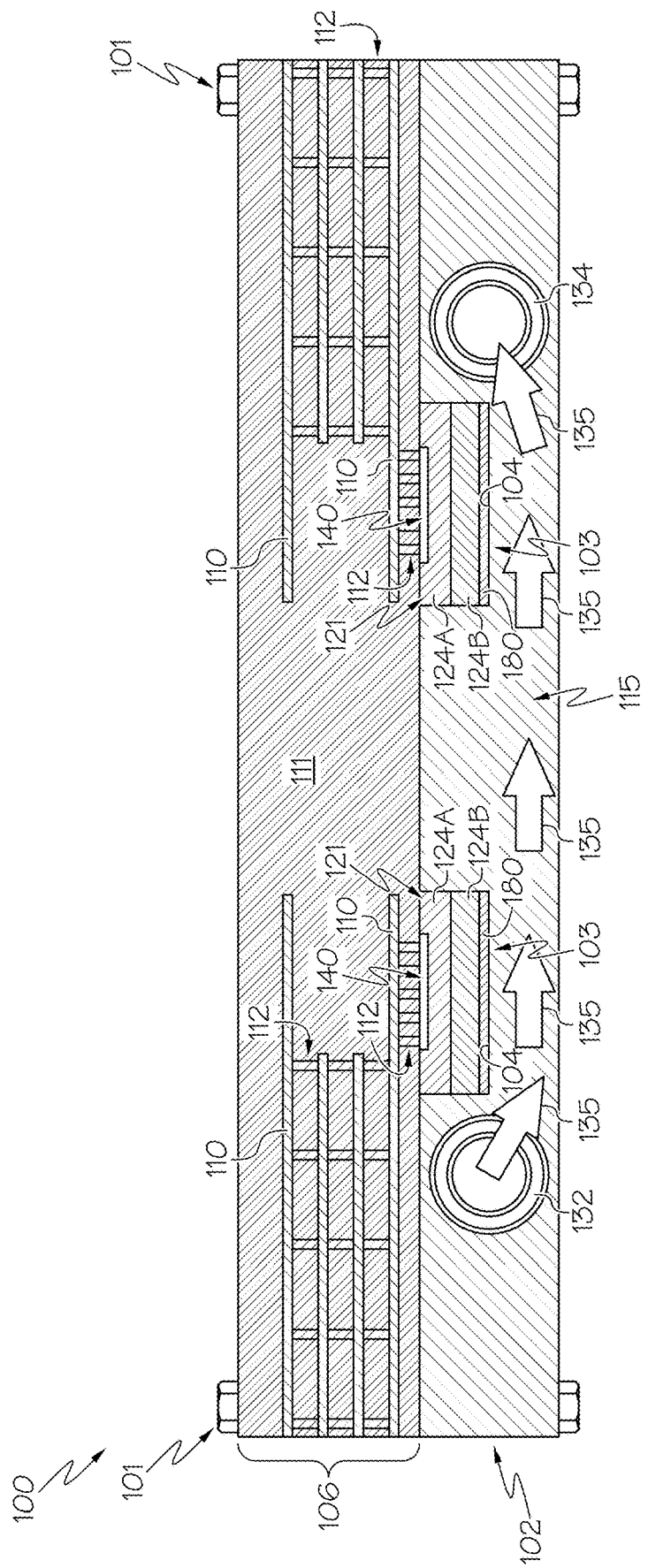
FIG. 10 schematically depicts a cross-section view of the power electronics assembly of FIG. 1, according to one or more embodiments shown and described herein.

In embodiments, the circuit board assembly 106 may be 3D printed layers. It should be appreciated that in such embodiments, the 3D printed layers of the circuit board assembly 106 reduce overall thermal resistance. In embodiments, the circuit board assembly 106 may be laminated to the cold plate 102. However, other additive manufacturing processes for affixing the circuit board assembly 106 to the cold plate 102 are also contemplated and included within the scope of the present disclosure. In addition, as described in more detail herein, via connections or vias may be made between the various components of the circuit board assembly 106 and the power electronics devices 140 (FIG. 4) using laser drilling. That is, the vias are drilled through the circuit board assembly 106 to the top surface of each conductive layer and the power electronics devices 140. As described in more detail herein, the vias are then filled with copper via an electroplating method to establish electrical connections between components such as, for example, power electronics devices 140, electrically conductive layers 110, and the like, as depicted in FIG. 10.

Figure 3:
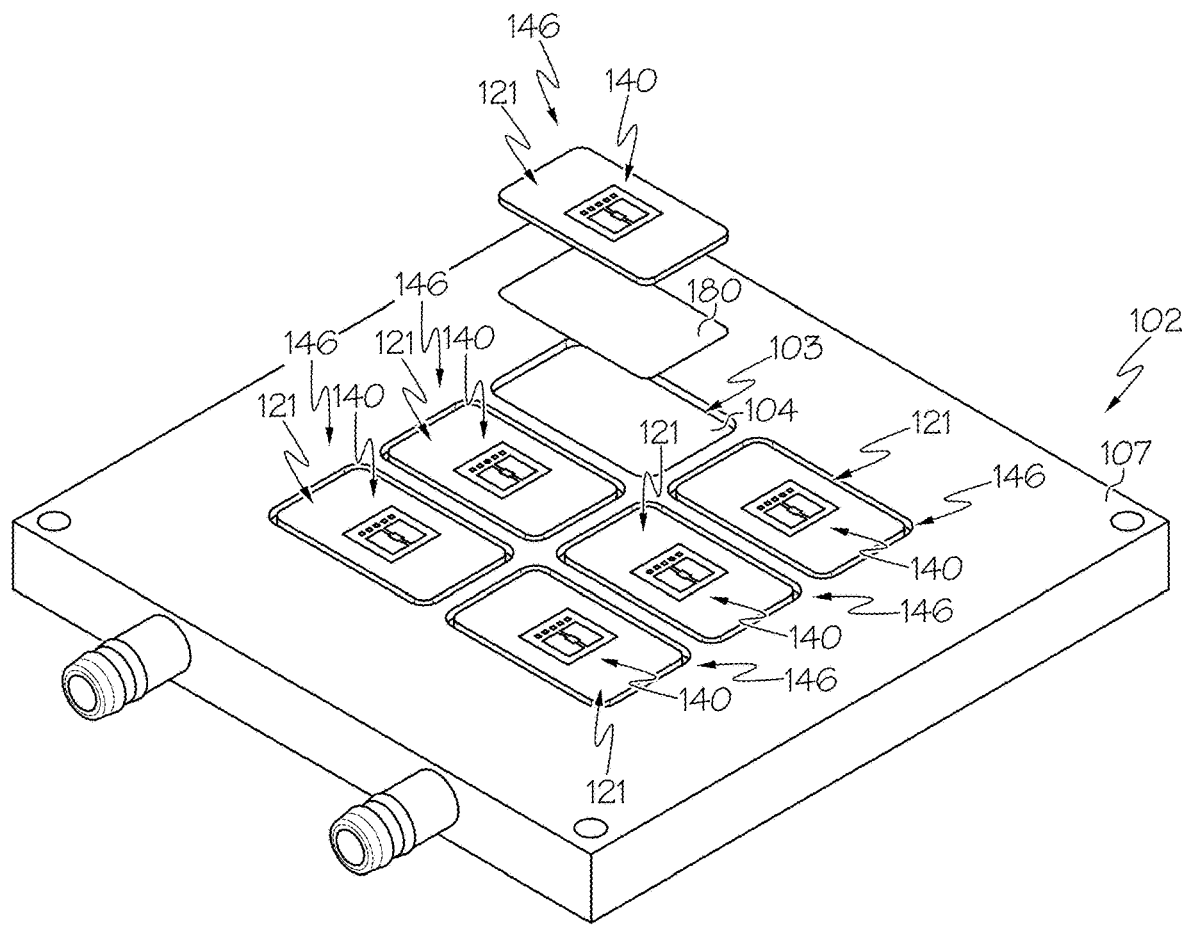
FIG. 3 schematically depicts a perspective view of a cold plate of the power electronics assembly of FIG. 1 including a plurality of power electronics device assemblies, according to one or more embodiments described and illustrated herein.

Referring now to FIG. 3, the cold plate 102 is shown including a plurality of power electronics device assemblies 146 positioned within respective cavities 103 formed in the first surface 107 of the cold plate 102, as described in greater detail herein. As a non-limiting example, the cold plate 102 may include six cavities 103 formed in the first surface 107 of the cold plate 102, arranged in two rows of three, for receiving six power electronics device assemblies 146 for an inverter circuit for an electric vehicle. However, it should be understood that any number of power electronics device assemblies 146 may be utilized depending on the application. Similarly, the power electronics device assemblies 146 may be positioned on the first surface 107 of the cold plate 102 in any suitable arrangement such as a greater number or a few number of rows than that illustrated in FIG. 3.

Each power electronics device assembly 146 includes an S-cell 121 received within a cavity 103 of the cold plate 102 and a power electronics device 140 coupled (e.g., affixed) to the S-cell 121. As stated above, the S-cell 121 is a substrate to which the power electronics device 140 is bonded. The S-cell 121 provides an electrically conductive surface area to make connections to electrodes on the bottom surface of the power electronics device 140. As described in more detail herein, the S-cell 121 further provides heat spreading functionality as well as electrical isolation. However, in some embodiments, an electrically insulating layer 180 may be interposed between the S-cell 121 and a base wall 104 of the cavity 103 of the cold plate 102 to provide additional electrical isolation.

The electrically insulating layer 180 is shown in FIG. 3 deposited within each cavity 103 of the cold plate 102 between the S-cell 121 and the base wall 104 of the cold plate 102 to lower the thermal resistance between the circuit board assembly 106 and the cold plate 102. The electrically insulating layer 180 may generally be any layer that provides electrical insulation, such as ceramic or the like. In embodiments, the electrically insulating layer 180 includes an insulation metal substrate (IMS) dielectric film. The IMS dielectric film may be a solid film layer. In other embodiments, the electrically insulating layer 180 may be a thermal grease layer. It is noted that the electrically insulating layer 180 may not have dedicated through-holes.

Figure 4:
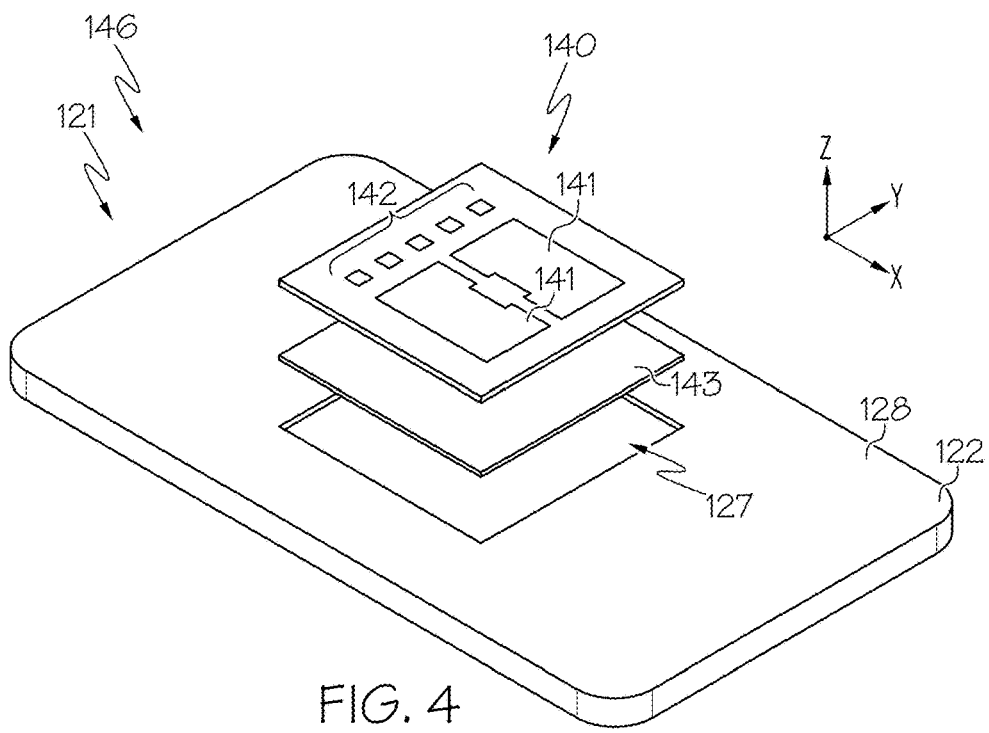
FIG. 4 schematically depicts an exploded perspective view of a power electronics device assembly of FIG. 3 including an S-cell and a power electronics device, according to one or more embodiments described and illustrated herein.
Figure 5:
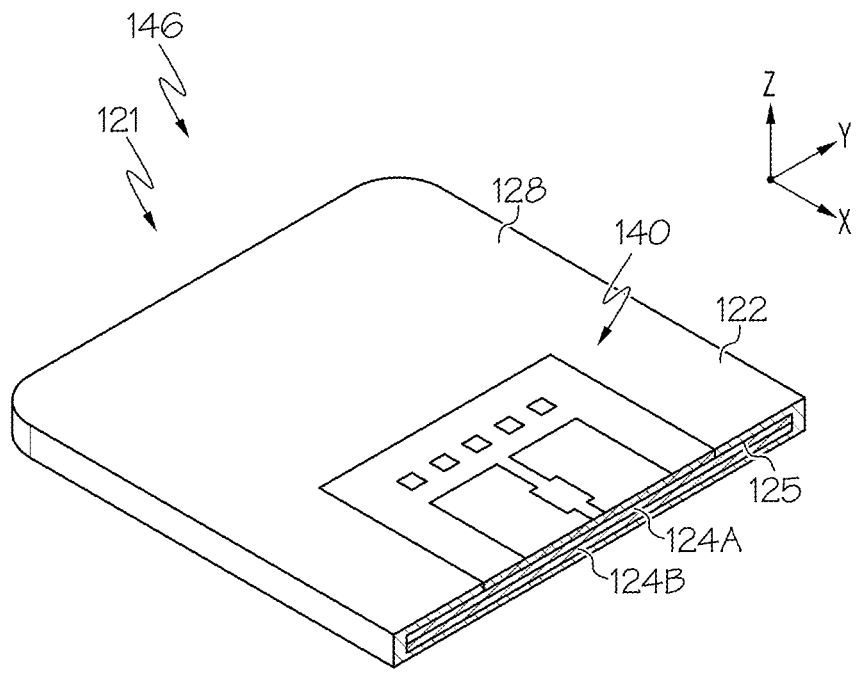
FIG. 5 schematically depicts a cross-section perspective view of the power electronics device assembly of FIG. 4, according to one or more embodiments described and illustrated herein.

Referring now to FIGS. 4 and 5 an exploded top perspective view and an assembled cross-sectional view, respectively, of an example S-cell 121 is shown. The S-cell 121 includes a plurality of stacked layers. Particularly, the S-cell 121 illustrated in FIGS. 4 and 5 includes a metal layer 122, a first graphite layer 124A, and a second graphite layer 124B embedded within the metal layer 122. However, as discussed herein, it should be appreciated that additional graphite layers may be provided. The first graphite layer 124A is positioned on top of the second graphite layer 124B. However, it should be appreciated that the first graphite layer 124A and the second graphite layer 124B are interchangeable. The metal layer 122 includes an inner surface 125 and an outer surface 128 opposite the inner surface 125. In embodiments, the metal layer 122 includes a first metal layer and a second metal layer with the graphite layers 124A, 124B positioned between the first metal layer and the second metal layer. In embodiments, the metal layer 122 may be a one-piece, monolithic structure rather than including a pair of metal layers. The metal layer 122 includes a recess 127 formed in the outer surface 128 of the metal layer 122. The recess 127 is dimensioned to receive a power electronics device 140. As described in more detail below, the metal layer 122 provides an electrically conductive surface to which electrodes on a bottom surface of the power electronics device 140 are connected (e.g., via a direct connection and/or via electrically connective vias). It should be appreciated that the various layers of the S-cell 121 depicted in FIGS. 4 and 5 is merely illustrative.

It is noted that the S-cell 121 in the embodiment depicted in FIGS. 4 and 5 includes the graphite layers 124A, 124B embedded within the metal layer 122 to provide an S-cell 121 that is symmetrical along a z-axis of the coordinate axes depicted in FIGS. 4 and 5. The symmetrical nature of the S-cell 121 balances forces on the S-cell 121 during the high-temperature bonding process. Because the metal layer 122 and the graphite layers 124A, 124B have different coefficients of thermal expansion, it may be desirable to have a symmetrical substrate stack to balance the thermally induced stresses during the bonding process.

The metal layer 122 may be made of any suitable metal or alloy. Copper and aluminum may be used as the metal layer 122 as non-limiting examples. As described herein, the metal layer 122 of the S-cell 121 has a recess 127 formed in the outer surface 128 of the metal layer 122. The recess 127 may be formed by chemical etching or machined, for example, or any other suitable process. The recess 127 has a size and shape to accept the power electronics device 140. The outer surface 128 may generally be a second major face or surface of the metal layer 122 that is opposite the inner surface 125 (which is configured as a first major face or surface of the metal layer 122). That is, the metal layer 122 may be a planar layer whereby the inner surface 125 faces the graphite layers 124A, 124B and the opposite outer surface 128 faces the power electronics device 140 and the circuit board assembly 106 (FIG. 10).

As depicted in FIGS. 4 and 5, the S-cell 121 is designed to be rectangular in shape such that its length dimension is greater than its width dimension. However, as discussed herein, the shape of the S-cell 121 is not limited to being rectangular. For example, the S-cell 121 may be square, for example, without departing from the scope of the present disclosure.

Figure 6:
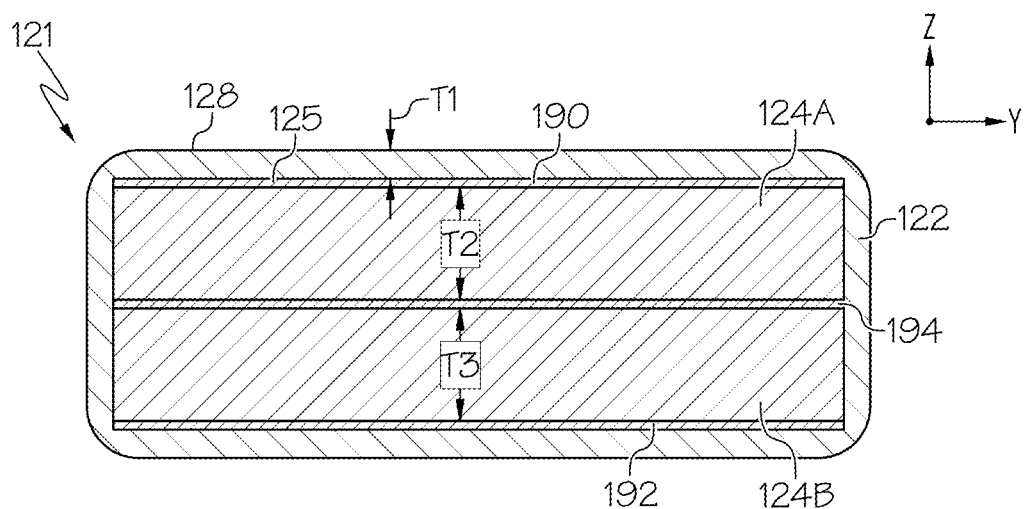
FIG. 6 schematically depicts a cross-section end view of the power electronics device assembly of FIG. 4, according to one or more embodiments described and illustrated herein.

Referring now to FIG. 6, a cross-sectional view of the S-cell 121 is depicted in which the first graphite layer 124A and the second graphite layer 124B are shown encased within the metal layer 122. Additionally, the S-cell 121 includes a first brazing layer 190 provided between the metal layer 122 and the first graphite layer 124A, and a second brazing layer 192 provided between the metal layer 122 and the second graphite layer 124B opposite the first brazing layer 190. It should be appreciated that the first brazing layer 190 and the second brazing layer 192 are provided on opposite planar surfaces of the S-cell 121 adjacent the inner surface 125 of the metal layer 122 such that the first brazing layer 190 faces the power electronics device 140 (FIG. 5) and the second brazing layer 192 faces the cold plate 102 (FIG. 3) when assembled. The S-cell 121 further includes a graphite bonding layer 194 provided between the first graphite layer 124A and the second graphite layer 124B. It should be appreciated that the first brazing layer 190, the second brazing layer 192, and the graphite bonding layer 194 each extend between opposite sides of the metal layer 122 of the S-cell 121 in a lateral direction (i.e., in a direction parallel to the y-axis of the coordinate axes depicted in the drawings) and a longitudinal direction (i.e., in a direction parallel to the x-axis of the coordinate axes depicted in the drawings) perpendicular to the lateral direction.

In embodiments, the metal layer 122 has a first thickness T1 extending between the inner surface 125 and the outer surface 128 equal to or greater than 0.1 mm and less than or equal to 0.5 mm. In embodiments, the metal layer 122 has a first thickness T1 extending between the inner surface 125 and the outer surface 128 equal to or greater than 0.2 mm and less than or equal to 0.3 mm. In embodiments, other than the recess 127 (FIG. 4) formed in the outer surface 128 of the metal layer 122, the first thickness T1 of the metal layer 122 is constant extending around an entire perimeter of the S-cell 121. In embodiments, the first graphite layer 124A has a second thickness T2 equal to or greater than 0.25 mm and less than or equal to 0.75 mm. In embodiments, the first graphite layer 124A has a second thickness T2 equal to or greater than 0.4 mm and less than or equal to 0.6 mm. In embodiments, the second graphite layer 124B has a third thickness T3 equal to or greater than 0.25 mm and less than or equal to 0.75 mm. In embodiments, the second graphite layer 124B has a third thickness T3 equal to or greater than 0.4 mm and less than or equal to 0.6 mm. Accordingly, a total thickness of the S-cell 121 extending across the first graphite layer 124A and the second graphite layer 124B is equal to or greater than 0.7 mm and less than or equal to 3 mm (i.e., the sum of twice the first thickness T1 of the metal layer 122, the second thickness T2 of the first graphite layer 124A, and the third thickness T3 of the second graphite layer 124B).

The graphite layers 124A, 124B depicted in the embodiment of FIG. 6 are provided to encourage heat spreading both across the S-cell 121 as well as toward the cold plate 102 (see, e.g., FIG. 10). It should be appreciated that the crystalline structure of graphite provides the graphite with high thermal conductivity, making it useful to conduct heat flux toward the cold plate 102. However, graphite does not have an isothermal profile. Rather, graphite has an anisothermal profile with high conductivity along two axes and low thermal conductivity in a third axis. To account for the anisothermal profile of graphite, each graphite layer 124A, 124B has a high thermal conductivity across two axes that differs from the two axes of the other graphite layer 124A, 124B to provide a balanced thermal conductivity along each of the three axes of the graphite layers 124A, 124B.

Figure 7:
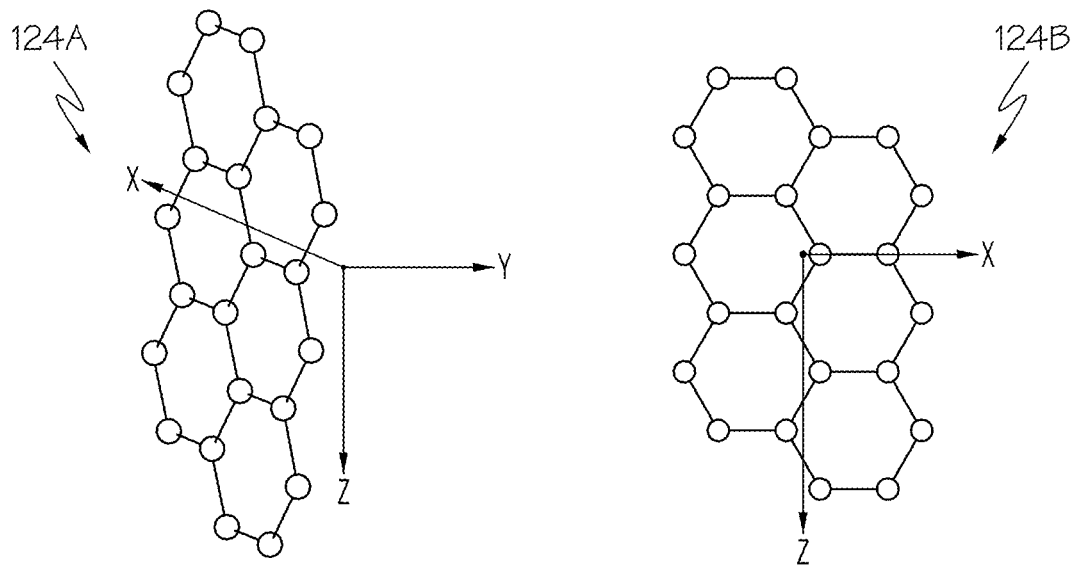
FIG. 7 schematically depicts an example crystalline structure of a first graphite layer and an example crystalline structure of a second graphite layer of the S-cell of FIG. 4, according to one or more embodiments described and illustrated herein.

As a non-limiting example, as shown in FIG. 7, the crystalline structure of the first graphite layer 124A and the second graphite layer 124B is depicted. Specifically, the first graphite layer 124A has high thermal conductivity along the x-axis (in-plane direction) and the z-axis (in-plane direction), and low thermal conductivity in the y-axis (out-plane direction). As described herein, it should be appreciated that reference to a low thermal conductivity provided reduced heat spread capabilities as compared to high thermal conductivity. Accordingly, heat spreads a limited distance along an axis having a low thermal conductivity as compared to heat that spreads along a different axis having a high thermal conductivity. The second graphite layer 124B is rotated 90 degrees about the z-axis relative to the first graphite layer 124A such that the y-axis of the first graphite layer 124A corresponds to the x-axis of the second graphite layer 124B. Accordingly, the combined heat spreading capabilities of the first graphite layer 124A and the second graphite layer 124B along the x-axis and the y-axis are substantially equal (i.e., within 5%, 10%, 20%, or 30%) rather than being disproportionate to one another when only a single graphite layer is utilized within an S-cell. This achieves a higher heat flux and a much lower temperature profile for the power electronics device 140 as compared to embodiments in which only a single graphite layer is utilized and/or the crystalline structure of the first graphite layer 124A and the second graphite layer 124B are oriented in the same direction (i.e., the low thermal conductivity of the graphite layers 124A, 124B extend along the same axis).

Figure 8:
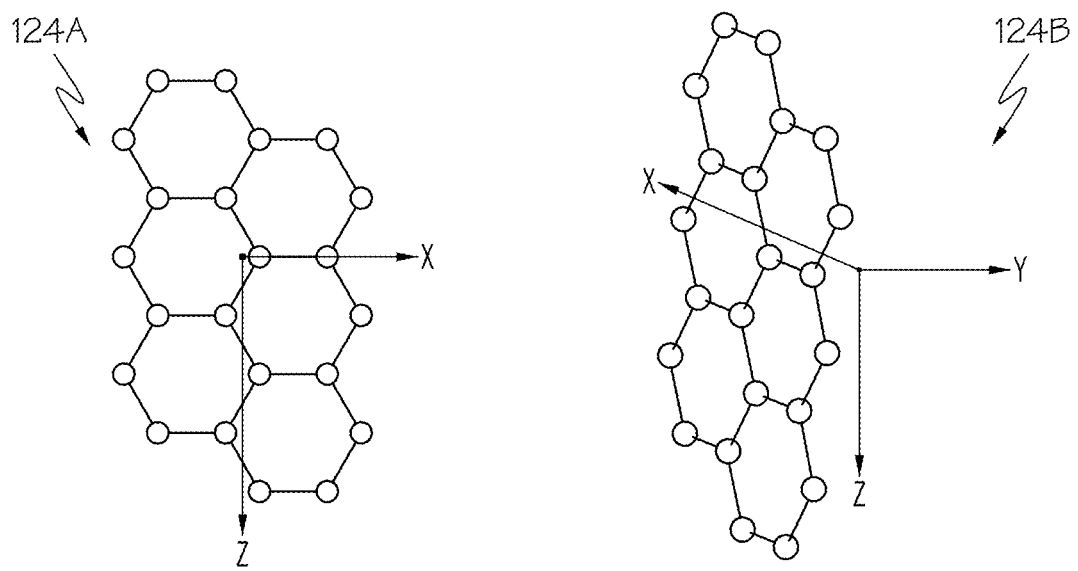
FIG. 8 schematically depicts another example crystalline structure of a first graphite layer and another example crystalline structure of a second graphite layer of the S-cell of FIG. 4, according to one or more embodiments described and illustrated herein.

As discussed herein, it should be appreciated that the first graphite layer 124A and the second graphite layer 124B are interchangeable. As such, either the first graphite layer 124A or the second graphite layer 124B may be rotated relative to the other. As another non-limiting example, as shown in FIG. 8, the crystalline structure of the second graphite layer 124B has high thermal conductivity along the x-axis (in-plane direction) and the z-axis (in-plane direction), and low thermal conductivity in the y-axis (out-plane direction). Similarly, the second graphite layer 124B is rotated 90 degrees about the z-axis relative to the first graphite layer 124A such that the y-axis of the second graphite layer 124B corresponds to the x-axis of the first graphite layer 124A. Accordingly, the combined heat spreading capabilities of the first graphite layer 124A and the second graphite layer 124B along the x-axis and the y-axis remain equal.

By rotating the graphite layers 124A, 124B relative to one another, this provides the additional benefit of allowing the S-cell 121 to be square as opposed to rectangular without providing disproportionate heat spreading across the S-cell 121. In embodiments in which the crystalline structure of the first graphite layer 124A and the second graphite layer 124B are oriented in the same direction, the S-cell 121 is typically rectangular in shape to improve heat spread along a length of the S-cell 121 rather than a width of the S-cell 121, or vice versa.

Figure 9:
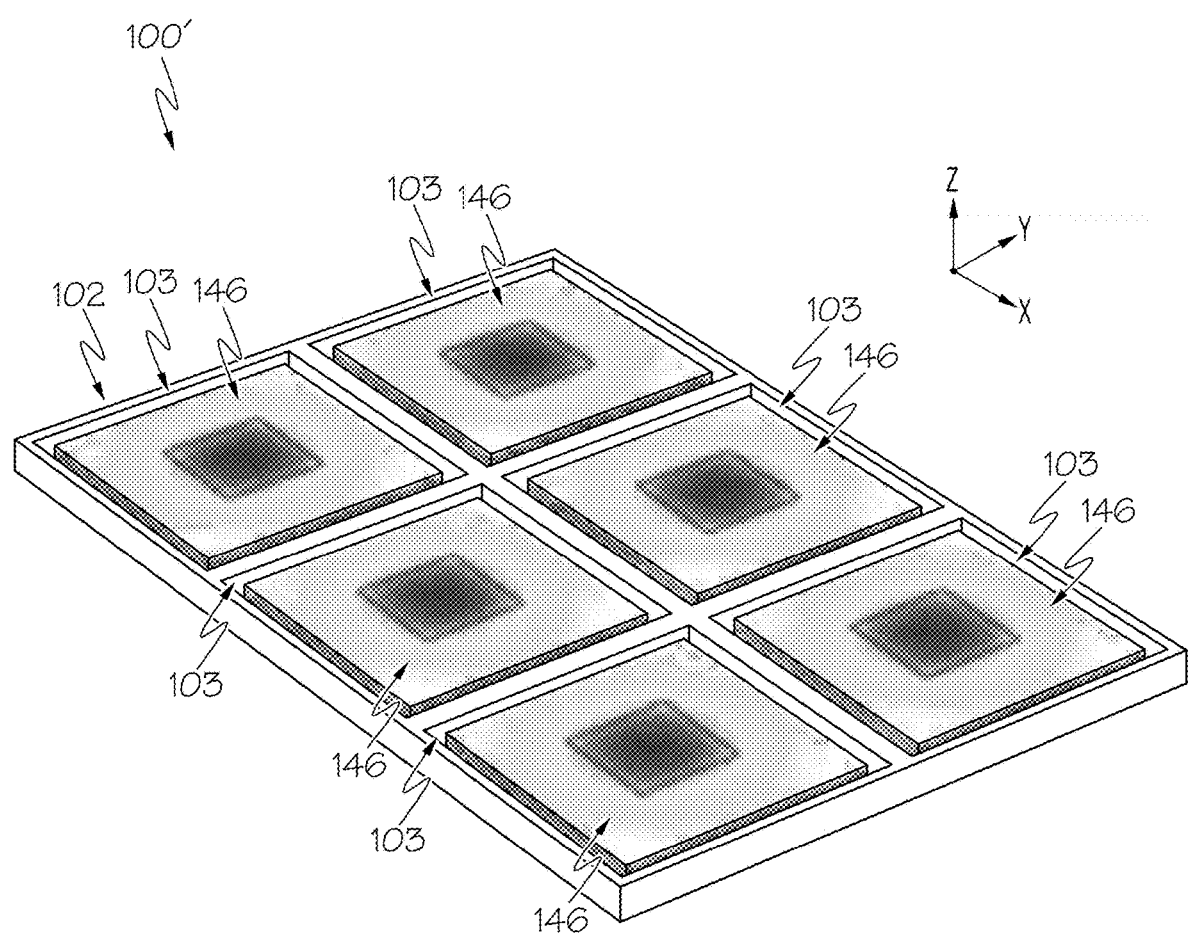
FIG. 9 schematically depicts a perspective view of another cold plate including a plurality of power electronics device assemblies, according to one or more embodiments described and illustrated herein.

Accordingly, as depicted in FIG. 9, an embodiment of a power electronics assembly 100' is depicted including the cold plate 102 and a plurality of S-cells 121 each having a square geometry rather than a rectangular geometry, as depicted in FIGS. 3 and 4. As shown in FIG. 9, heat spreading across the S-cells 121 is shown to be equal both across a width of the S-cells 121 and a length of the S-cells 121. In stark contrast, in embodiments in which one of the graphite layers 124A, 124B is not rotated relative to the other or only a single graphite layer is utilized in the S-cell 121, the heat spreading is significantly greater along a corresponding one of the length and width of the corresponding S-cell 121.

Although not shown herein, it should be appreciated that the power electronics device assemblies 146 may include more than the pair of graphite layers 124A, 124B. For example, the power device assemblies 146 may include three, four, or more than four graphite layers positioned in any suitable arrangement such as, for example, one or more lower graphite layers and one or more upper graphite layers provided on the lower graphite layers and rotated 90 degrees relative to the one or more lower graphite layers such that the crystalline structure of the lower graphite layers differs from the upper graphite layers. As another non-limiting example, the graphite layers may alternate such that graphite layers having a crystalline structure arranged in a first orientation are interposed between graphite layers having a crystalline structure arranged in a second orientation different from the first orientation, i.e., 90 degrees offset.

Referring again to FIG. 4, an exploded view of a power electronics device assembly 146 is depicted including the S-cell 121 and the power electronics device 140. FIG. 4 depicts the power electronics device 140 and a bonding layer 143 with respect to the recess 127 of the S-cell 121. The bonding layer 143 may be a solder layer, for example. As another example, the bonding layer 143 may be a transient liquid phase bonding layer 143. The power electronics device 140 includes a plurality of large electrodes 141 and a plurality of small electrodes 142 on a top surface of the power electronics device 140. The large electrodes 141 may be power electrodes, while the small electrodes 142 may be signal electrodes. It is noted that, although not visible in FIG. 4, the power electronics device 140 further includes one or more electrodes on a bottom surface of the power electronics device 140. The one or more electrodes on the bottom surface of the power electronics device 140 are electrically connected to the metal layer 122 by placement of the power electronics device 140 into the recess 127. Thus, electrical connection to the bottom electrodes of the power electronics device 140 may be made by way of the metal layer 122.

Referring now to FIG. 10, a cross-sectional view of the power electronics assembly 100 is illustrated. The circuit board assembly 106 includes a substrate 111 made of an electrically insulating material. The electrically insulating material may be a material used in the fabrication of printed circuit boards, such as, without limitation, FR-4. The circuit board assembly 106 further includes embedded electrically conductive layers 110, a plurality of vias 112 (both electrically conducting vias and thermal vias). As discussed briefly herein, the vias 112 establish electrical connections between components such as, for example, the power electronics devices 140, the electrically conductive layers 110, and the like. In some embodiments, the circuit board assembly 106 may include a plurality of power electronics device assemblies 146 fully or partially embedded therein. However, the embodiment depicted in FIG. 10 shows the power electronics device assemblies 146 received within an S-cell 121 that is disposed within a cavity 103 of the cold plate 102, as described in greater detail herein.

Cooling fluid (depicted as moving arrows 135) from a reservoir (not shown) flows into the fluid chamber 115 through the fluid inlet 132 and out of the fluid chamber 115 through the fluid outlet 134, where it is returned to the reservoir, such as after flowing through a heat exchanger (not shown) to remove heat from the cooling fluid. Although not shown, an array of fins may be provided in the fluid chamber 115 to provide additional surface area for heat transfer to the cooling fluid 135.

From the above, it is to be appreciated that defined herein are power electronics assemblies and methods for fabricating the same. Specifically, the power electronics assemblies disclosed herein include a power electronics assembly including a cold plate. The cold plate includes a power electronics device assembly including an S-cell and a power electronics device. The S-cell includes a first graphite layer, a second graphite layer, and a metal layer encasing the first graphite layer and the second graphite layer. A recess is formed in an outer surface of the metal layer. The power electronics device is disposed within the recess of the outer surface of the S-cell. In embodiments, the first graphite layer is oriented to provide a low thermal conductivity along a first axis and a high thermal conductivity along a second axis and a third axis, and the second graphite layer is oriented to provide a low thermal conductivity along the second axis and a high thermal conductivity along the first axis and the third axis. Accordingly, a heat distribution of the S-cell is substantially equal along the first axis and the second axis.

It should now be understood that embodiments of the present disclosure are directed to power electronics assemblies having a circuit board assembly coupled to a power electronics device assembly that includes a cold plate containing an S-cell. A power electronics device may be embedded within the S-cell and/or within the circuit board assembly. Such power electronics assemblies are compact, provide increased thermal conductivity while maintaining the ability to electrically insulate S-cells, thereby improving heat flux from the S-cell to the cold plate, thereby increasing heat spreading and cooling performance of the circuit board assembly relative to conventional packages.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

It will be apparent to those skilled in the art that various modifications and variations can be made to the embodiments described herein without departing from the scope of the claimed subject matter. Thus, it is intended that the specification cover the modifications and variations of the various embodiments described herein provided such modification and variations come within the scope of the appended claims and their equivalents.

What is claimed is:

1. A power electronics assembly comprising:
a cold plate comprising:
a power electronics device assembly comprising:
an S-cell comprising:
a first graphite layer;
a second graphite layer; and
a metal layer encasing the first graphite layer and the second graphite layer; and
a power electronics device disposed within the S-cell,
wherein the first graphite layer is oriented to provide a low thermal conductivity along a first axis and a high thermal conductivity along a second axis and a third axis, and
wherein the second graphite layer is oriented to provide a low thermal conductivity along the second axis and a high thermal conductivity along the first axis and the third axis.

2. The power electronics assembly of claim 1, wherein a heat distribution of the S-cell is substantially equal along the first axis and the second axis.

3. The power electronics assembly of claim 1, wherein the S-cell has a square shape.

4. The power electronics assembly of claim 1, wherein the first graphite layer and the second graphite layer each have a thickness equal to or greater than 0.2 mm and less than or equal to 0.3 mm.

5. The power electronics assembly of claim 1, wherein a plurality of power electronics device assemblies are embedded within respective recesses formed in a surface of the cold plate.

6. The power electronics assembly of claim 5, wherein an electrically insulating layer is interposed between each S-cell and the cold plate.

7. A power electronics device assembly comprising:
an S-cell comprising:
a first graphite layer;
a second graphite layer; and
a metal layer encasing the first graphite layer and the second graphite layer; and
a power electronics device disposed within the S-cell,
wherein the first graphite layer is oriented to provide a low thermal conductivity along a first axis and a high thermal conductivity along a second axis and a third axis, and
wherein the second graphite layer is oriented to provide a low thermal conductivity along the second axis and a high thermal conductivity along the first axis and the third axis.

8. The power electronics device assembly of claim 7, wherein a heat distribution of the S-cell is substantially equal along the first axis and the second axis.

9. The power electronics device assembly of claim 7, wherein the S-cell has a square shape.

10. The power electronics device assembly of claim 7, wherein the first graphite layer and the second graphite layer each have a thickness equal to or greater than 0.2 mm and less than or equal to 0.3 mm.

11. The power electronics device assembly of claim 7, further comprising:
   a first brazing layer provided between the metal layer and the first graphite layer; and
   a second brazing layer provided between the metal layer and the second graphite layer opposite the first brazing layer.

12. The power electronics device assembly of claim 11, further comprising a graphite bonding layer provided between the first graphite layer and the second graphite layer.

13. A power electronics assembly comprising:
   a cold plate comprising:
      a plurality of power electronics device assemblies comprising:
         an S-cell comprising:
            a first graphite layer oriented to provide a low thermal conductivity along a first axis and a high thermal conductivity along a second axis and a third axis;
            a second graphite layer oriented to provide a low thermal conductivity along the second axis and a high thermal conductivity along the first axis and the third axis; and
            a metal layer encasing the first graphite layer and the second graphite layer, a recess formed in an outer surface of the metal layer; and
         a power electronics device disposed within the recess of the outer surface of the S-cell,
      wherein the plurality of power electronics device assemblies are embedded within respective recesses formed in a surface of the cold plate.

14. The power electronics assembly of claim 13, wherein a heat distribution of the S-cell is substantially equal along the first axis and the second axis.

15. The power electronics assembly of claim 13, wherein the S-cell has a square shape.

16. The power electronics assembly of claim 13, wherein the first graphite layer and the second graphite layer each have a thickness equal to or greater than 0.2 mm and less than or equal to 0.3 mm.

17. The power electronics assembly of claim 13, wherein an electrically insulating layer is interposed between each S-cell and the cold plate.

18. The power electronics assembly of claim 17, wherein the electrically insulating layer includes an insulation metal substrate dielectric film.

\* \* \* \* \*